United States Patent
Utsumi et al.

(10) Patent No.: US 7,838,323 B2
(45) Date of Patent: *Nov. 23, 2010

(54) METHOD FOR FABRICATING SEMICONDUCTOR DEVICE

(75) Inventors: Masaki Utsumi, Kyoto (JP); Takahiro Kumakawa, Kyoto (JP); Masami Matsuura, Kyoto (JP); Yoshihiro Matsushima, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/578,040

(22) Filed: Oct. 13, 2009

(65) Prior Publication Data

US 2010/0022046 A1 Jan. 28, 2010

Related U.S. Application Data

(63) Continuation of application No. 11/798,676, filed on May 16, 2007.

(30) Foreign Application Priority Data

Jun. 9, 2006 (JP) ............................. 2006-160927
Jan. 9, 2007 (JP) ............................. 2007-001227

(51) Int. Cl.
*H01L 21/00* (2006.01)

(52) U.S. Cl. .................. 438/53; 438/463; 257/E21.599

(58) Field of Classification Search .................. 438/463, 438/53; 257/E21.599
See application file for complete search history.

(56) References Cited

U.S. PATENT DOCUMENTS 5,452,268 A * 9/1995 Bernstein .................... 367/181
6,992,026 B2 1/2006 Fukuyo et al.
7,211,526 B2 5/2007 Iri et al.
7,232,741 B2 * 6/2007 Nagai et al. .................. 438/463

(Continued)

FOREIGN PATENT DOCUMENTS

JP 2000-340527 12/2000

(Continued)

OTHER PUBLICATIONS

Ning et al., "Fabrication of a silicon micromachined capacitive microphone using a dry-etch process", Sensors and Actuators A, 53 (1996), pp. 237-242.*

(Continued)

*Primary Examiner*—Matthew C Landau
*Assistant Examiner*—Sun M Kim
(74) *Attorney, Agent, or Firm*—McDermott Will & Emery LLP

(57) ABSTRACT

A method for fabricating a semiconductor device includes: the step (a) of forming a vibrating film on a predetermined region of each of a plurality of chips included in a semiconductor wafer; the step (b) of forming, on the semiconductor wafer, an intermediate film containing a sacrifice layer located on the vibrating film of each of the chips; and the step (c) of forming a fixed film on the intermediate film. This method further includes, after the step (c), the step (d) of subjecting the semiconductor wafer to blade dicing to separate the chips, and the step (e) of removing, by etching, the sacrifice layer to provide a cavity between the vibrating film and the fixed film.

8 Claims, 14 Drawing Sheets

U.S. PATENT DOCUMENTS

| | | |
|---|---|---|
| 7,514,286 B2 | 4/2009 | Ozawa |
| 2002/0067663 A1* | 6/2002 | Loeppert et al. ............ 367/181 |
| 2002/0076873 A1 | 6/2002 | Spooner et al. |
| 2003/0133588 A1 | 7/2003 | Pedersen |
| 2003/0196592 A1 | 10/2003 | Hartzell |
| 2004/0002199 A1 | 1/2004 | Fukuyo et al. |
| 2004/0140534 A1 | 7/2004 | Yoshihara et al. |
| 2005/0048800 A1 | 3/2005 | Wagener |
| 2005/0218488 A1 | 10/2005 | Matsuo |
| 2006/0011593 A1 | 1/2006 | Fukuyo et al. |
| 2006/0169049 A1* | 8/2006 | Matsubara ................... 73/754 |
| 2007/0217635 A1 | 9/2007 | Ogura et al. |

FOREIGN PATENT DOCUMENTS

| | | |
|---|---|---|
| JP | 3408805 | 3/2003 |
| JP | 3500813 | 2/2004 |
| JP | 2004-335583 | 11/2004 |
| JP | 2005-020411 | 1/2005 |
| JP | 2005-116844 | 4/2005 |
| JP | 2005-166728 | 6/2005 |
| JP | 2005-191208 | 7/2005 |
| JP | 2006-268752 | 9/2005 |
| JP | 2005-340423 | 12/2005 |
| JP | 2006-062002 | 3/2006 |
| JP | 2006-074025 | 3/2006 |
| JP | 2006-088268 | 4/2006 |
| JP | 2006-287165 | 7/2006 |
| JP | 2006-196588 | 10/2006 |
| WO | WO2005/083764 | 9/2005 |
| WO | WO2005/086534 | 9/2005 |

OTHER PUBLICATIONS

Chinese Office Action, w/ English translation thereof, issued in Chinese Patent Application No. CN 200710106430.1 dated Nov. 6, 2009.

Japanese Notice of Reasons for Rejection, with English Translation, issued in Japanese Patent Application No. JP 2007-001227, mailed on Jun. 9, 2009.

Japanese Notice of Reasons for Rejection, with English Translation, issued in Japanese Patent Application No. JP 2007-001227, mailed on Jul. 28, 2009.

* cited by examiner

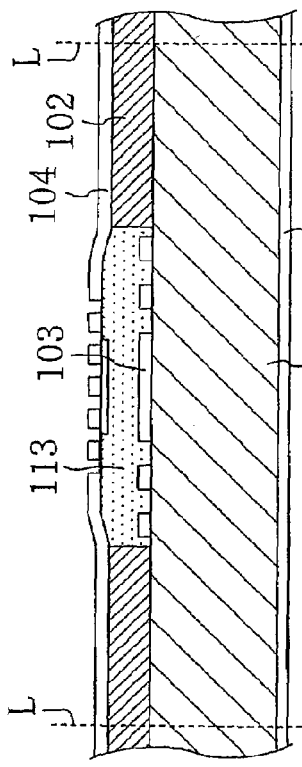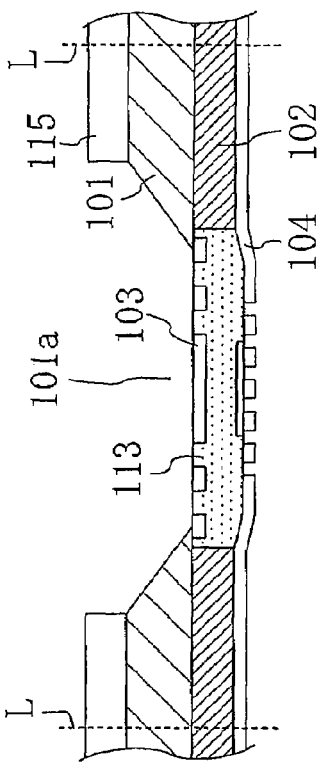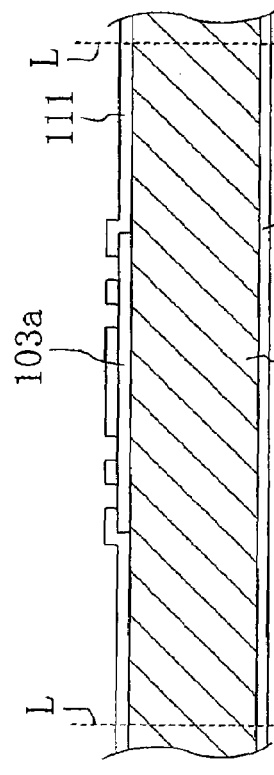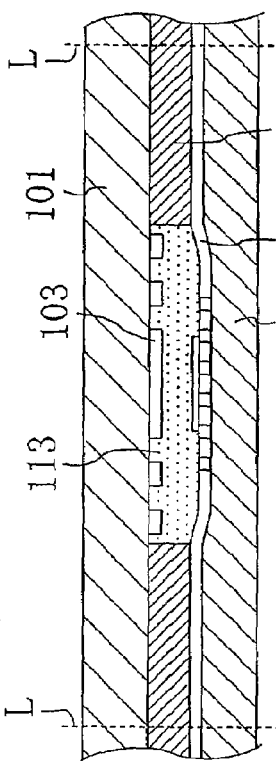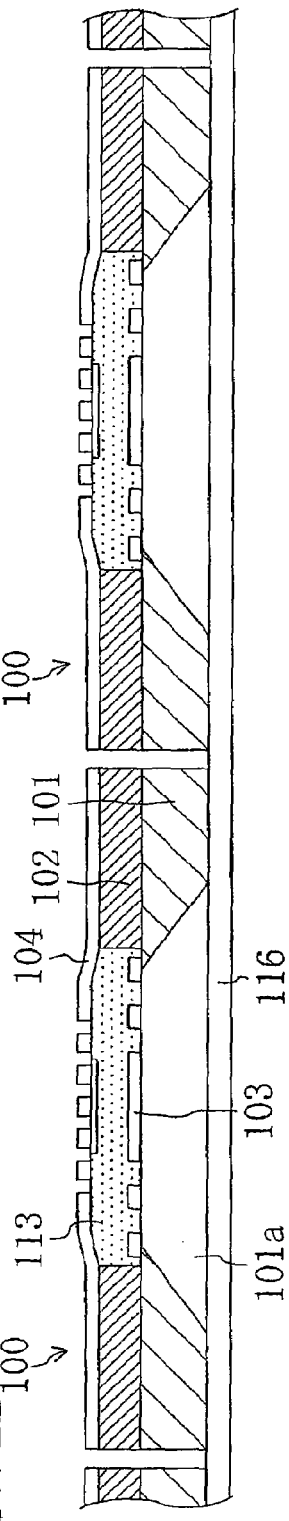

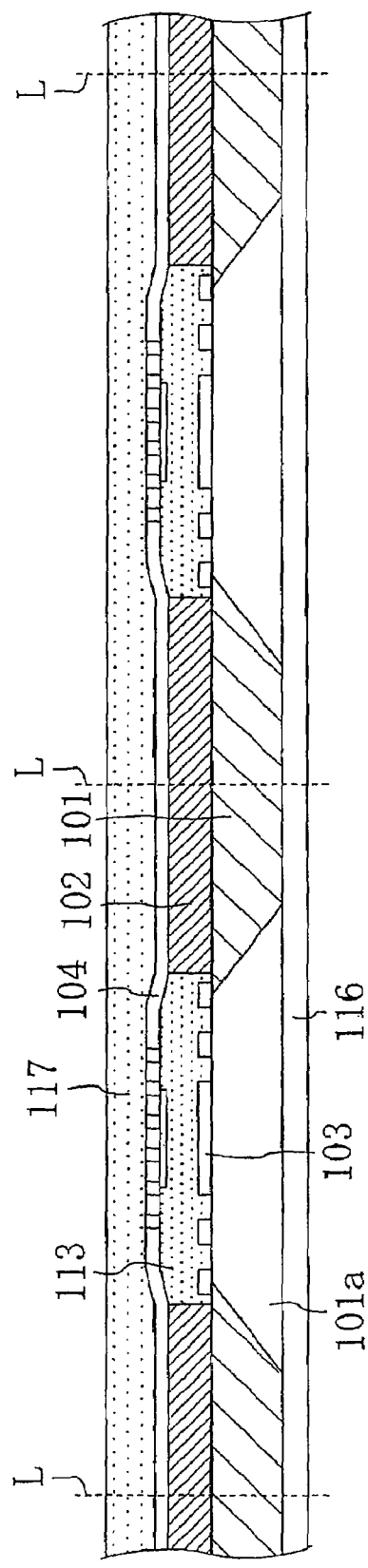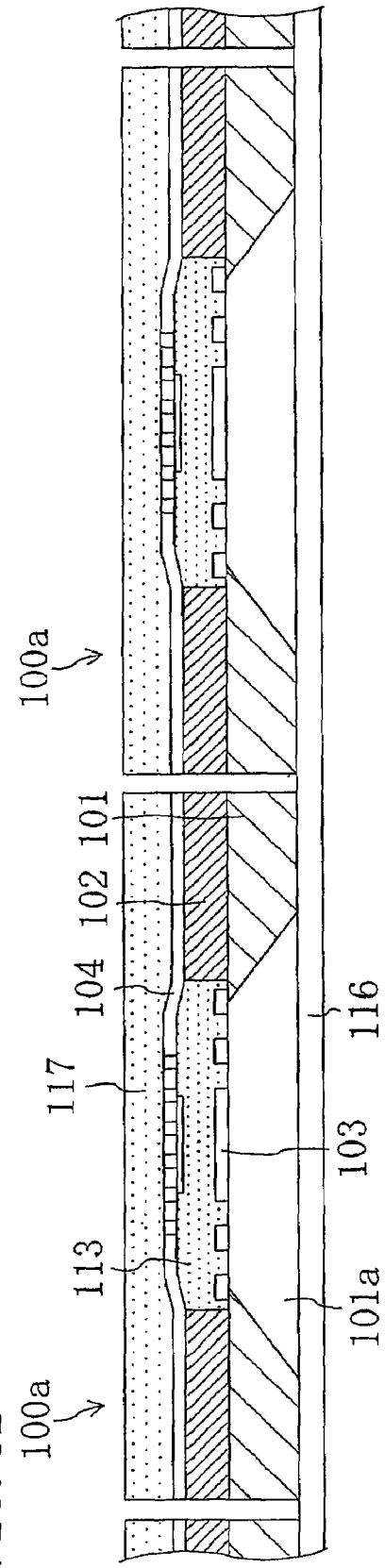

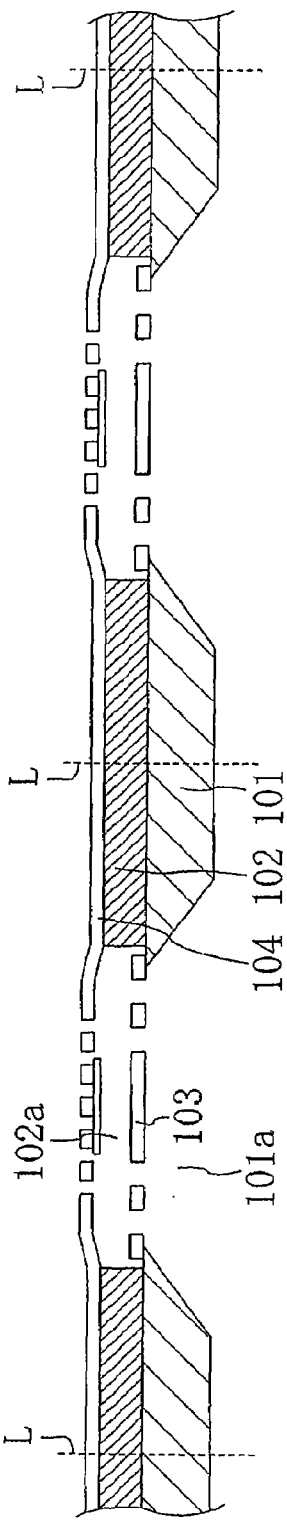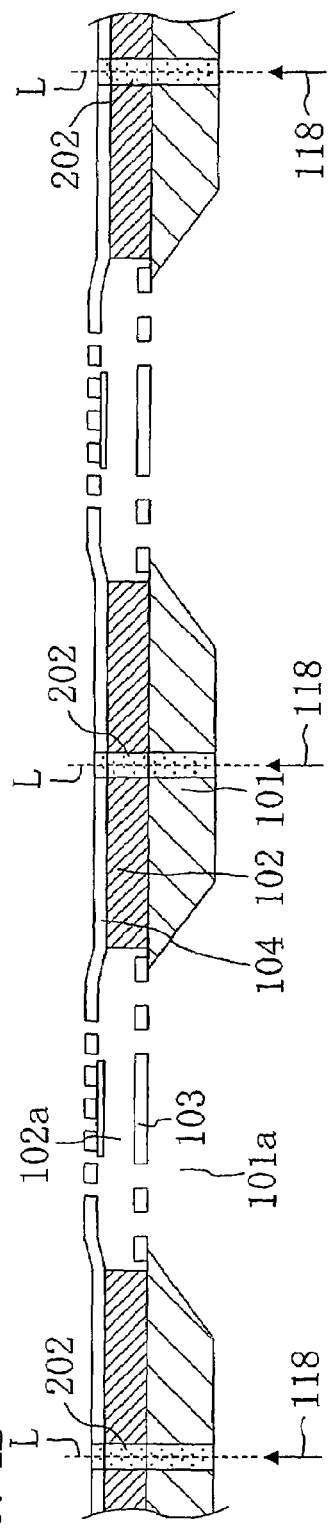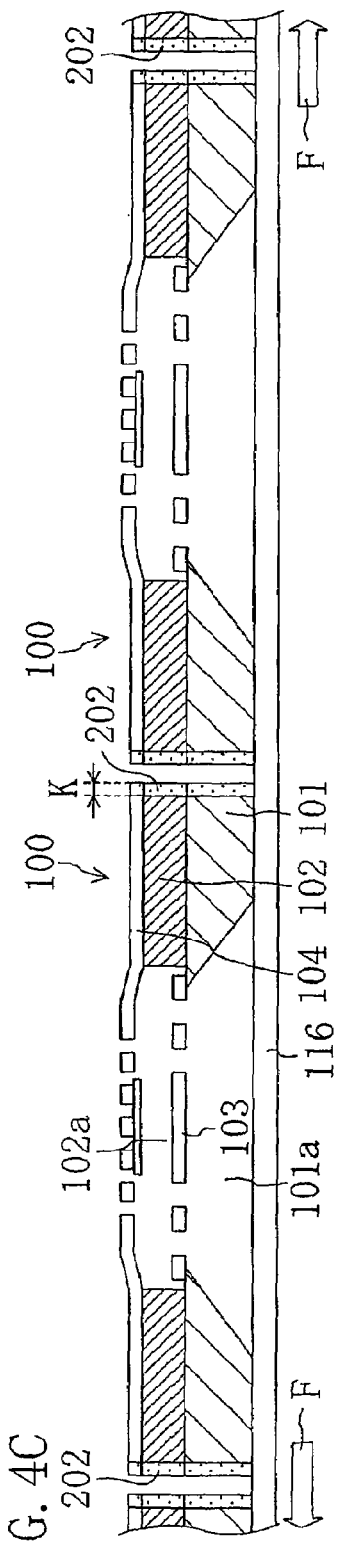

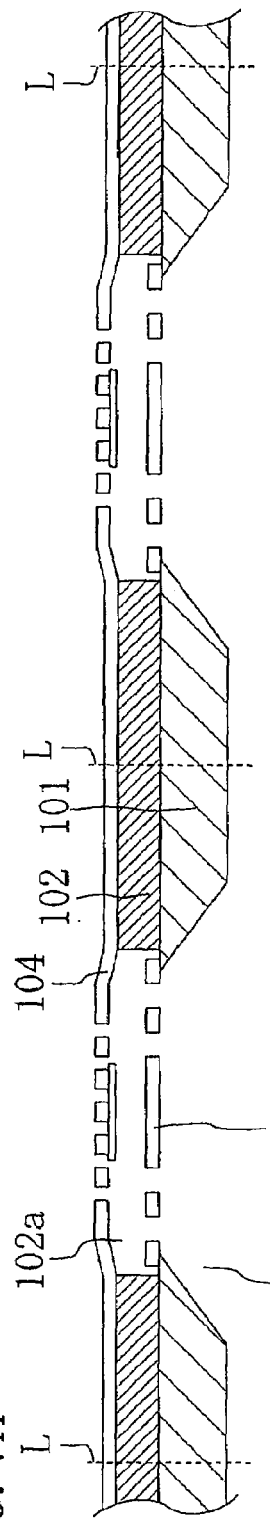
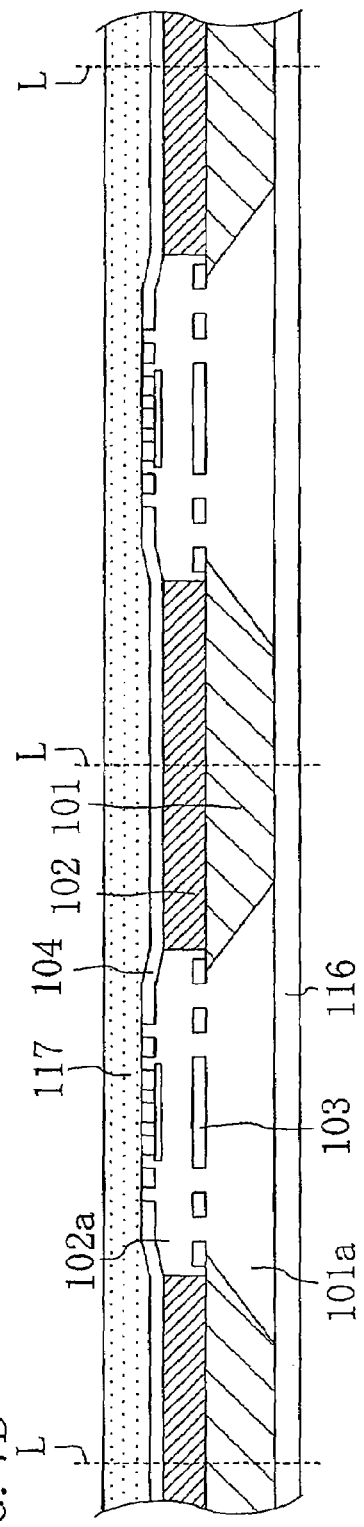
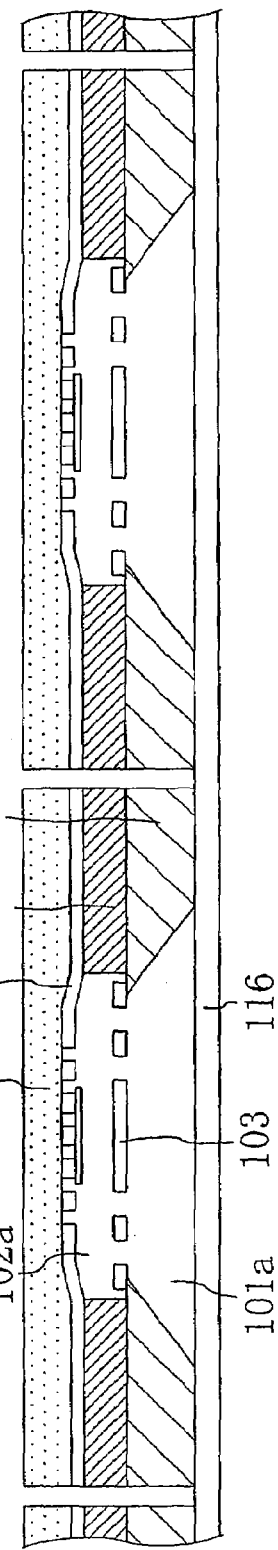

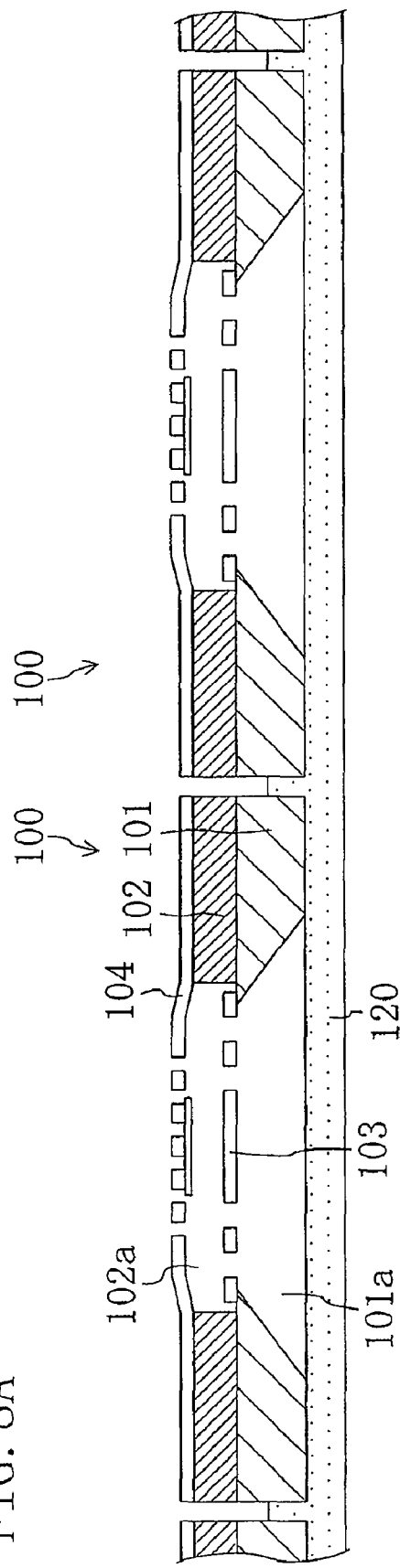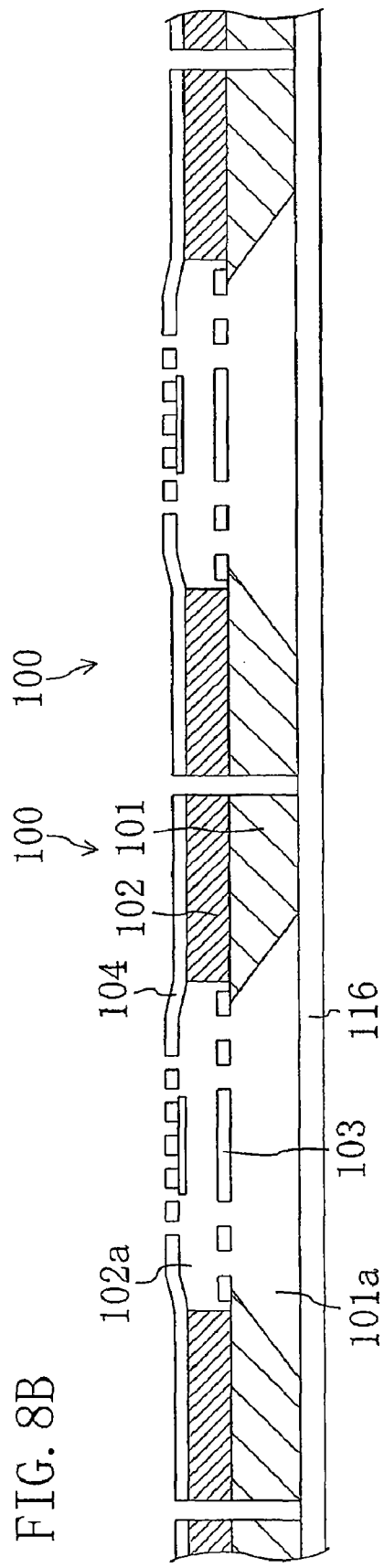

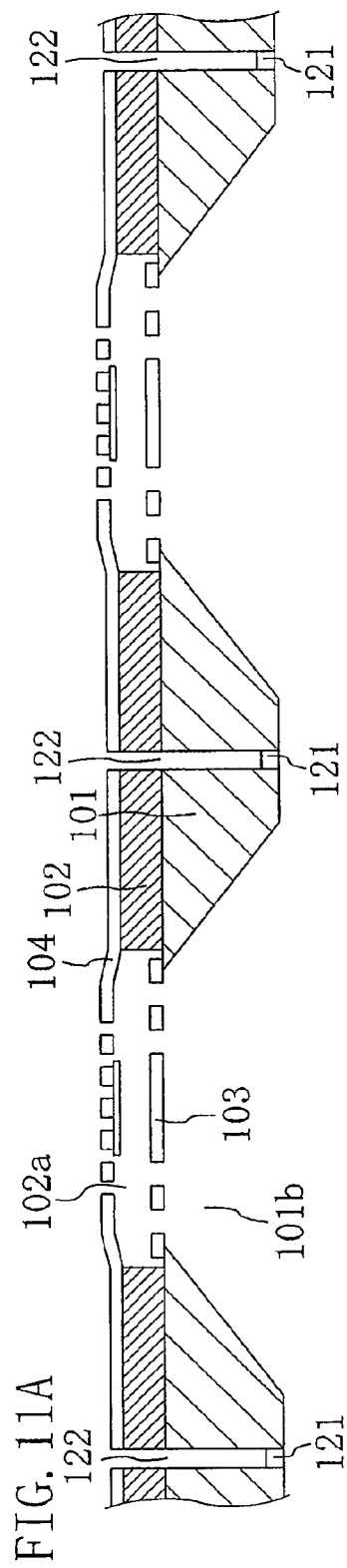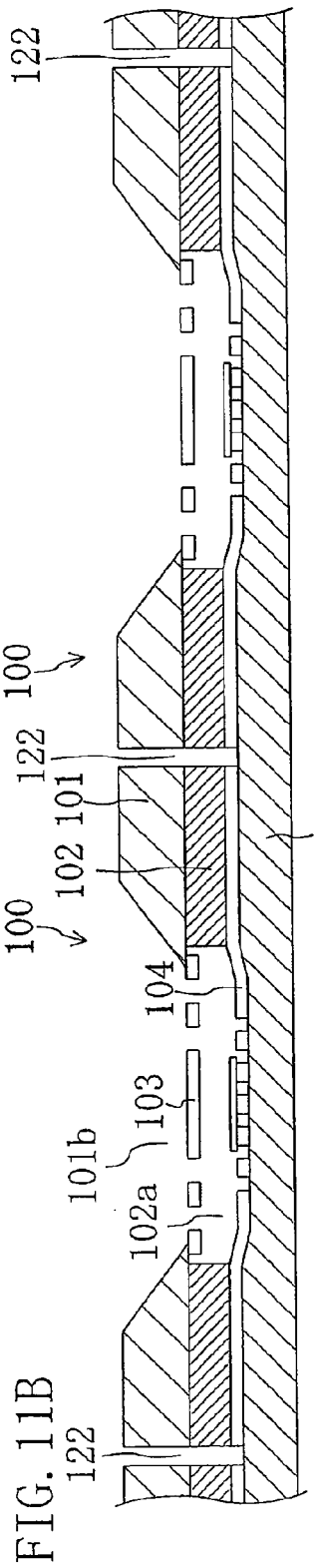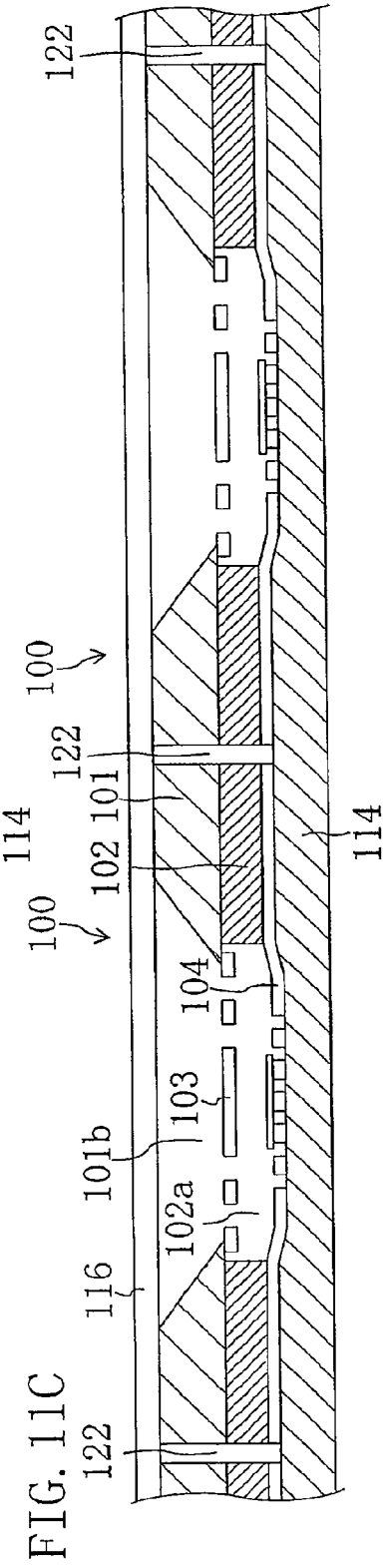

METHOD FOR FABRICATING SEMICONDUCTOR DEVICE

CROSS-REFERENCE TO RELATED APPLICATIONS

This application is a Continuation of patent application Ser. No. 11/798,676 filed on May 16, 2007, which claims foreign priority under 35 U.S.C. §119 on Patent Application No. 2006-160927 filed in Japan on Jun. 9, 2006, and Patent Application No. 2007-001227 filed in Japan on Jan. 9, 2007, the entire contents of which are hereby incorporated by reference.

BACKGROUND OF THE INVENTION (a) Fields of the Invention

The present invention relates to fabrication methods of a semiconductor device, and in particular to dicing methods thereof.

(b) Description of Related Art

Fabrication of a semiconductor device is typically made so that a great number of chips having various types of elements such as transistors are formed on a wafer and then dicing is performed to cut the wafer into chips. In thus performing a dicing, the wafer or the element may be broken to cause a decrease in the fabrication yield of the semiconductor device. For example, when blade dicing is performed, chipping sometimes occurs at the chip end. If this chipping reaches a region in the semiconductor device formed with the various types of elements such as transistors, the function of the semiconductor device is broken.

Various techniques for avoiding such breakage in dicing have been studied before.

As one example of the techniques, a semiconductor wafer dicing method disclosed in Japanese Patent No. 3500813 will now be described with reference to FIGS. 13A and 13B.

FIG. 13A shows a cross section of a portion of a semiconductor wafer 11. Although not particularly shown, the semiconductor wafer 11 is provided with chips having various types of elements. The wafer 11 is cut (diced) along a cutting line L in a scribe region R, thereby separating chips. The scribe region R is provided between the chips and used for dicing. In this cross section, in the scribe region R on the semiconductor wafer 11, insulating films 12 are provided on both sides of the cutting line L, respectively.

FIG. 13B shows how the semiconductor wafer 11 is being subjected to dicing by a blade 13. The dicing is performed along the cutting line L located between the two insulating films 12. During this dicing, even if the surface of the wafer 11 becomes chipped (a chipped shape 14 is created), the chipping is stopped by the insulating film 12. That is to say, the chipping is hindered from advancing more inwardly than the insulating film 12. Thus, the fabrication yield of the semiconductor device can be prevented from being degraded by chipping.

SUMMARY OF THE INVENTION

In a typical dicing process, however, if a structure formed on a semiconductor wafer has a portion with a poor strength, the portion will be broken. This may result in extremely bad fabrication yield.

In general, dicing using a blade is performed with cleaning liquid (for example, water) supplied for removal of cutting fragments or other purposes. Thus, during dicing, a pressure from water is applied to the semiconductor wafer. As a result of this, if a portion with a poor strength is present in the structure formed in the semiconductor wafer, this portion is likely to be damaged by the water pressure.

Particularly, in the case where the semiconductor device has a hollow portion, it is conceivable that a thin film covering the hollow portion is easily broken by water pressure. Hence, the challenge to be addressed is realization of a semiconductor which has a structure with a poor-strength portion and concurrently which can avoid such breakage.

In view of the foregoing, the present invention offers a reliable fabrication method of a semiconductor device which has a structure with a poor-strength portion such as a thin film covering a hollow portion.

A first method for fabricating a semiconductor device according to the present invention includes: the step (a) of forming a vibrating film on a predetermined region of each of a plurality of chips included in a semiconductor wafer; the step (b) of forming, on the semiconductor wafer, an intermediate film containing a sacrifice layer located on the vibrating film of each of the chips; the step (c) of forming a fixed film on the intermediate film; the step (d) of subjecting the semiconductor wafer to blade dicing to separate the chips; and the step (e) of removing, by etching each of the chips, the sacrifice layer to provide a cavity between the vibrating film and the fixed film.

With the method for fabricating a semiconductor device according to the present invention, dicing is performed in the state in which the fixed film is stacked onto the sacrifice layer, and then the sacrifice layer is removed. Therefore, breakage of the fixed film in the dicing can be prevented. As a result of this, for example, the semiconductor device can be fabricated which has a MEMS (Micro Electro Mechanical Systems) microphone structure provided with the vibrating film and the fixed film with the cavity interposed therebetween.

Preferably, the method further includes, before the step (d), the step of providing a protective film on the fixed film. With this method, breakage of the fixed film in dicing can be prevented more reliably to improve the fabrication yield of the semiconductor device.

Preferably, in the step (e), the protective film is removed together with the sacrifice layer. With this method, an independent process step for removing the protective film does not have to be provided, so that the semiconductor device can be fabricated with an increase in the number of process steps suppressed.

Next, a second method for fabricating a semiconductor device according to the present invention includes: the step (a) of forming a vibrating film on a predetermined region of each of a plurality of chips included in a semiconductor wafer; the step (b) of forming, on the semiconductor wafer, an intermediate film containing a sacrifice layer located on the vibrating film of each of the chips; the step (c) of forming a fixed film on the intermediate film; the step (d) of removing, by etching the semiconductor wafer, the sacrifice layer to provide a cavity between the vibrating film and the fixed film; and the step (e) of subjecting the semiconductor wafer to laser dicing to separate the chips.

With this method, even after removal of the sacrifice layer, the fixed film provided above the cavity is never broken in dicing because laser dicing is performed without supplying cleaning water. As a result of this, the MEMS microphone structure can be fabricated which is provided with the vibrating film and the fixed film with the cavity interposed therebetween.

Preferably, in the second method for fabricating a semiconductor device, in the step (e), a surface protective tape is stuck onto the surface of the semiconductor wafer formed with the fixed film, and then the laser dicing is performed from the other-surface side of the semiconductor wafer.

With this method, since dicing can be performed with the surface protective tape protecting the fixed film, breakage of the fixed film can be prevented more reliably.

In addition, preferably, in the step (e), a dicing tape is stuck onto the surface of the semiconductor wafer opposite to the surface formed with the fixed film, and then the laser dicing is performed from the surface side thereof formed with the fixed film. Also in this case, dicing can be performed with the surface protective tape protecting the fixed film.

As described above, laser dicing can be performed from either surface side of the semiconductor wafer. In the region (scribe lane) of the semiconductor wafer to be subjected to dicing, a metal film, a diffusion layer, an oxide film, or the like existing on either surface of the semiconductor wafer may reflect the laser, which would make it impossible to perform laser dicing. However, since the laser radiation for dicing can be performed from either surface side of the semiconductor wafer, the surface to be radiated with a laser can be selected conveniently.

Preferably, the second method for fabricating a semiconductor device further includes, after the step (d) and before the step (e), the step of sticking a surface protective tape onto the surface of the semiconductor wafer formed with the fixed film, and then grinding the other surface of the semiconductor wafer, and in the step (e), the laser dicing is performed from the other-surface side of the semiconductor wafer.

With this method, in both of the step of dicing and the step of grinding the surface of the semiconductor wafer opposite to the surface formed with the fixed film (back grinding), the surface protective tape can protect the fixed film. As a result of this, the necessity to stick respective tapes for back grinding and dicing can be eliminated to reduce the number of process steps.

Preferably, the step (e) includes: the substep of radiating the surrounding of each of the chips with a laser to form an altered layer surrounding each said chip; and the substep of applying a force to the semiconductor wafer to separate the chips along the altered layer.

In the laser-radiated portions of the semiconductor wafer, the intermediate layer, and the fixed film, their respective materials alter to produce the altered layer. The physical strength of the altered layer is degraded as compared with the physical strength before alteration, so that application of a force to the semiconductor wafer causes wafer cutting along the altered layer. Thus, by providing the altered layer by laser radiation conducted to surround the respective chips and then applying a force to the semiconductor wafer, the chips can be separated from each other. The laser dicing can be performed in the manner described above.

A third method for fabricating a semiconductor device according to the present invention includes: the step (a) of forming a vibrating film on a predetermined region of each of a plurality of chips included in a semiconductor wafer; the step (b) of forming, on the semiconductor wafer, an intermediate film containing a sacrifice layer located on the vibrating film of each of the chips; the step (c) of forming a fixed film on the intermediate film; the step (d) of removing, by etching the semiconductor wafer, the sacrifice layer to provide a cavity between the vibrating film and the fixed film; and the step (e) of providing, after the step (d), a protective film on the fixed film, and subjecting the resulting semiconductor wafer to blade dicing to separate the chips.

With the third method for fabricating a semiconductor device according to the present invention, the semiconductor wafer is subjected to dicing with the protective film preventing breakage of the fixed film. Thus, the semiconductor device can be reliably fabricated which has the structure provided with the vibrating film and the fixed film with the cavity interposed therebetween.

Preferably, the third method for fabricating a semiconductor device further includes, after the step (e), the step of removing the protective film with each of the chips held on a chip holder. With this method, the protective film can be removed reliably.

Preferably, in the third method for fabricating a semiconductor device, in the step (e), the blade dicing is performed in the state in which a dicing tape is stuck onto the surface of the semiconductor wafer opposite to the surface formed with the fixed film, and the method further comprises, after the step (e), the step of removing the surface protective film from each of the chips which are held stuck onto the dicing tape.

With this method, the protective film can be removed reliably, and concurrently moving the chip to the chip holder is eliminated.

A fourth method for fabricating a semiconductor device according to the present invention includes: the step (a) of forming a vibrating film on a predetermined region of each of a plurality of chips included in a semiconductor wafer; the step (b) of forming, on the semiconductor wafer, an intermediate film containing a sacrifice layer located on the vibrating film of each of the chips; the step (c) of forming a fixed film on the intermediate film; the step (d) of forming, from the fixed film side, a groove in portions of the fixed film, the intermediate film, and the semiconductor wafer, the groove surrounding each of the chips; the step (e) of removing, by etching the semiconductor wafer formed with the groove, the sacrifice layer to provide a cavity between the vibrating film and the fixed film; and the step (f) of grinding, after the step (e), the surface of the semiconductor wafer opposite to the surface formed with the groove until the ground surface reaches the groove, thereby separating the chips.

With the fourth method for fabricating a semiconductor device, first, in the state in which the fixed film is stacked onto the sacrifice layer, the groove surrounding each of the chips is formed from the surface side of the semiconductor wafer formed with the fixed film. In this formation, the groove is formed not to reach the other surface of the semiconductor wafer (formed to reach the halfway depth of the wafer), whereby the resulting semiconductor wafer is in the state in which the chips each containing the vibrating film and the like are connected to each other only at around the other surface of the wafer. Since dicing is performed with the sacrifice layer remaining, breakage of the fixed film during this step is prevented.

Next, the semiconductor wafer in the state described above is etched to remove the sacrifice layer, and then the other surface of the semiconductor wafer is ground (back grinding). This grinding is performed to reach the groove which extends from the surface thereof formed with the fixed film, thereby removing the portions of the semiconductor wafer which connect the chips. As a result, the wafer is cut into the separate chips. In the manner described above, the semiconductor device can be fabricated with breakage of the fixed film or the like avoided.

Preferably, in the step (d), the groove is formed a predetermined distance away from the vibrating film of each of the chips.

During etching for removing the sacrifice layer, it is conceivable that the semiconductor wafer is also etched from the side surface of the groove and thus the function of the semiconductor device to be fabricated is affected. To avoid this trouble, the groove is arranged so that it is spaced away from the vibrating film by a predetermined distance containing a margin in consideration of such etching of the side surface of the groove. Thus, the semiconductor device can be reliably fabricated while the influence of the etching of the side surface of the groove is avoided.

As described above, with the method for fabricating a semiconductor device according to the present invention, by removing the sacrifice layer after formation of the fixed film on the sacrifice layer, the semiconductor device can be fabricated in which the fixed film is formed above the cavity. In this method, removal of the sacrifice layer after dicing, dicing by a laser, provision of the protective film on the fixed film, or back grinding after formation of the groove with the halfway depth can prevent the fixed film from being broken by a pressure from cleaning liquid applied during dicing, and thereby the semiconductor device can be fabricated reliably. Thus, the semiconductor wafer can be formed into chips while both of breakage of the portion having a poor-strength structure during dicing and the occurrence of contaminants are prevented. Accordingly, the method is useful particularly in fabrication of a MEMS microphone chip or the like.

BRIEF DESCRIPTION OF THE DRAWINGS

FIGS. 2A to 2E are views illustrating a method for fabricating a semiconductor device according to a first embodiment of the present invention.

FIGS. 3A and 3B are views illustrating a method for fabricating a semiconductor device according to a modification of the first embodiment of the present invention.

FIGS. 4A to 4C are views illustrating a method for fabricating a semiconductor device according to a second embodiment of the present invention.

FIGS. 7A to 7C are views illustrating a method for fabricating a semiconductor device according to a third embodiment of the present invention.

FIGS. 8A and 8B are views following FIGS. 7A to 7C, which illustrate the method for fabricating a semiconductor device according to the third embodiment of the present invention.

FIGS. 11A to 11C are views following FIGS. 10A and 10B, which illustrate the method for fabricating a semiconductor device according to the fourth embodiment of the present invention.

DETAILED DESCRIPTION OF THE PREFERRED EMBODIMENTS

Hereinafter, embodiments of the present invention will be described by using fabrication of a MEMS microphone chip as an example. First, the MEMS microphone chip refers to a semiconductor device having a structure shown in FIG. 1.

Figure 1:
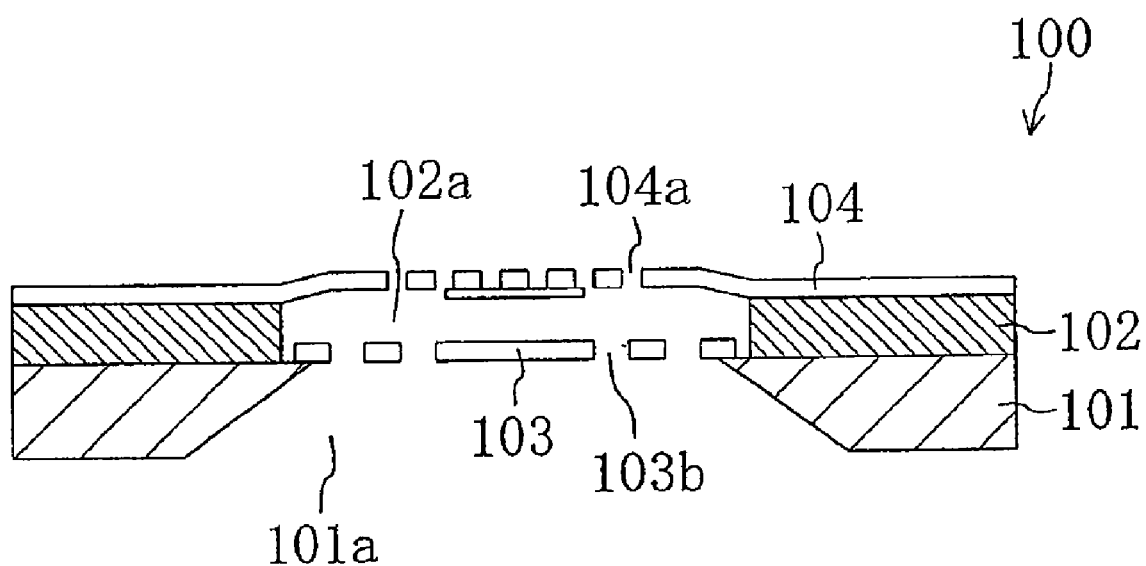
FIG. 1 is a view illustrating the structure of a semiconductor device (a MEMS microphone chip 100) fabricated in each embodiment of the present invention.

Referring to FIG. 1, the MEMS microphone chip 100 is fabricated using a semiconductor substrate 101. The semiconductor substrate 101 has a through hole 101a, and on the semiconductor substrate 101, an intermediate film 102 is provided which has a cavity 102a located above the through hole 101a. Also, above the through hole 101a, a vibrating film 103 is provided to stop up the through hole 101a. Furthermore, a fixed film 104 is provided to cover the intermediate film 102 and the cavity 102a.

As shown above, the cavity 102a is interposed between the vibrating film 103 and the fixed film 104. A portion of the fixed film 104 located over the cavity 102a is provided with a sound hole 104a, and also the vibrating film 103 is provided with a hole 103b. As can be seen from this structure, the sound hole 104a through the fixed film 104 has the function of taking in sound from the outside of the MEMS microphone chip 100 to the inside of the MEMS microphone chip 100. The hole 103b of the vibrating film 103 has the function of matching atmospheric pressure of the inside to that of the through hole area.

In the MEMS microphone chip 100 with this structure, sound wave introduced through the sound hole 104a vibrates the vibrating film 103. This vibration changes the distance between the fixed film 104 and the vibrating film 103, which in turn changes the capacitance between the fixed film 104 as an upper electrode and the vibrating film 103 as a lower electrode. This change in capacitance can be taken out as an electrical signal. In the manner described above, sound wave can be converted into an electrical signal.

In the respective embodiments that will be described below, description is made of a fabrication method of the MEMS microphone chip 100 (which, however, does not mean that the present invention is limited only to MEMS microphone chip fabrication). In particular, detailed description will be made of a method for forming the vibrating film 103 and the fixed film 104 which have poor strengths because of their extremely thin, independent portions (which do not have a structure reinforced by stacking another film thereon).

In the fabricated MEMS microphone chip 100, contaminants may occur within the cavity 102a.

Figure 14:
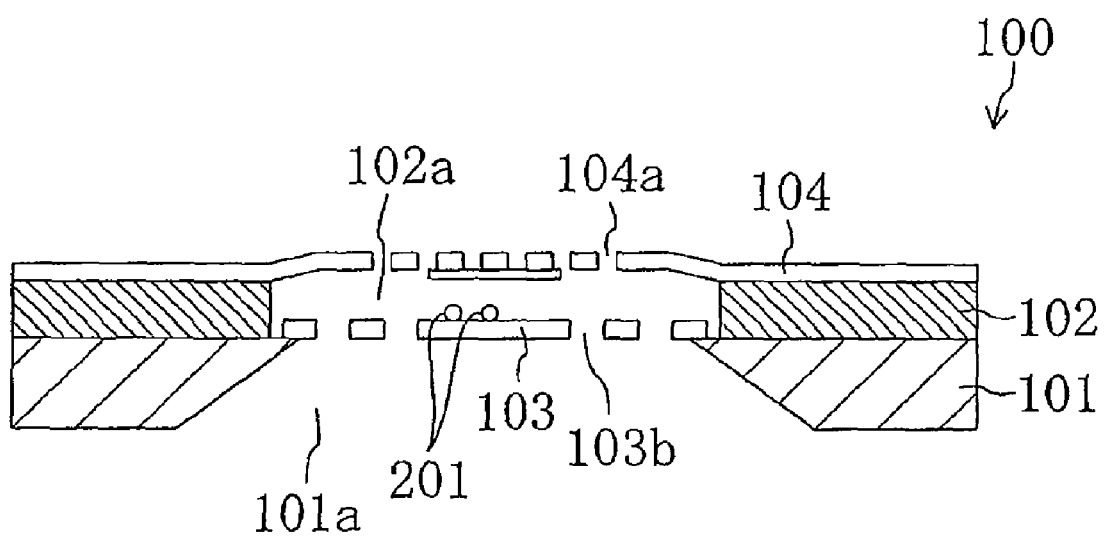
FIG. 14 is a view illustrating contaminants 201 which may occur within a cavity 102a of the MEMS microphone chip 100 and which can be reduced in the present invention.

Herein, the contaminants refer to, for example, fragments of the semiconductor wafer 101, fragments of a dicing tape, broken pieces of a blade used for dicing, or the like, which are caused in fabrication processes of the MEMS microphone chip 100. If such contaminants 201 are smaller than the hole 103b or the sound hole 104a, they may go, as shown in FIG. 14, from the hole 103b or the sound hole 104a into the cavity 102a during fabrication processes of the MEMS microphone chip 100, and remain in the cavity 102a even after completion of the fabrication processes. Although FIG. 14 shows the contaminants 201 adhering onto the vibrating film 103, it is also conceivable that they adhere to the side surfaces of the fixed film 104 and the intermediate film 102, and the side surface of the semiconductor wafer 101.

If such contaminants 201 occur, the performance of the MEMS microphone chip 100 is degraded. In particular, the frequency response thereof as a microphone is degraded, and thereby it becomes difficult for the chip to ensure a necessary quality. This causes degradation of the fabrication yield of the MEMS microphone chip 100.

Because of poor strengths of the vibrating film 103 and the fixed film 104 or other reasons, removal of the contaminants 201 having occurred once is not easy. Therefore, it is desirable to prevent the occurrence thereof.

First Embodiment

A method for fabricating a semiconductor device according to a first embodiment of the present invention will be described below with reference to the accompanying drawings.

FIGS. 2A to 2E show a fabrication method of the MEMS microphone chip 100 according to the first embodiment.

Referring to FIG. 2A, first, a stack material film 103a to be formed into the vibrating film 103 is formed on one side of the semiconductor wafer 101 (referred hereinafter to as a front surface). The stack material film 103a may have a structure made by stacking, for example, a SiN film, a PS (Poly Silicon) film, a TEOS (Tetraetylorthosilicate) film, and a SiN film in this order from bottom to top.

Next, an etching stopper film 111 of, for example, a $SiO_2$ film is formed to cover the stack material film 103a. The etching stopper film 111 has a pattern corresponding to the etching shape of the vibrating film 103.

Note that in some cases, in forming the stack material film 103a, for example, an oxide film 112 is formed on the surface of the semiconductor wafer 101 opposite to the surface formed with the stack material film 103a (referred hereinafter to as a back surface).

FIG. 2A also shows a cutting line L along which the dicing is to be performed in a later process. By the dicing along the cutting line L, an area containing one stack-material film 103a is formed into one chip. Although only one structure is shown in FIG. 2A, a plurality of such structures to be formed into chips, respectively, are simultaneously formed on the semiconductor wafer 101.

Thereafter, etching is performed using the etching stopper film 111 as a mask to form the stack material film 103a into the vibrating film 103 with the shape shown in FIG. 2B. It is sufficient that, during this step, for example, dry etching with a fluorine-based gas is performed on the SiN film and wet etching with a hydrofluoric acid-based solvent is performed on the PS film.

Subsequently, as shown in FIG. 2B, the intermediate film 102 having a sacrifice layer 113 on the vibrating film 103 is formed on the semiconductor wafer 101. Further, the fixed film 104 is formed to cover the sacrifice layer 113 and the intermediate film 102.

In this structure, the sacrifice layer 113 and the intermediate film 102 are formed of, for example, BPSG (Boron Phosphorous Silicate Glass), and the fixed film 104 is formed of a stacked film having the same composition as the vibrating film 103. That is to say, the fixed film 104 of the first embodiment has a structure made by stacking a SiN film, a PS film, a TEOS film, and a SiN film in this order from bottom to top.

In the MEMS microphone chip 100 of the first embodiment, the intermediate film 102 and the sacrifice layer 113 are simultaneously formed as one layer, and thereafter only a portion of the layer located on the vibrating film 103 is removed as the sacrifice layer 113. However, their formation procedure is not limited to this, and it is conceivable that the intermediate film 102 and the sacrifice layer 113 are formed separately. In this case, different materials may be used for them.

As shown in FIG. 2C, the semiconductor wafer 101 is subjected to back grinding. To be more specific, the back surface of the semiconductor wafer 101 (the surface thereof opposite to the surface formed with the vibrating film 103) is ground to thin the semiconductor wafer 101. This process is performed with a BG (back grinding) tape 114 stuck onto the fixed film 104. As the BG tape 114, use may be made of, for example, a polyethylene tape with acrylic adhesive applied thereto.

Next, as shown in FIG. 2D, a mask 115 of a silicon oxide film or the like is formed on the back surface of the semiconductor wafer 101, and the semiconductor wafer 101 is etched using this mask. Thereby, the semiconductor wafer 101 is formed with the through hole 101a extending from the back surface, so that the vibrating film 103 is exposed with the surface facing the through hole 101a.

Subsequently, the semiconductor wafer 101 is subjected to dicing along the cutting line L to separate chips from each other, thereby forming chips 100a. For this dicing, a dicing tape 116 is stuck onto the back surface of the semiconductor wafer 101, and in this state, the dicing is performed with a blade. FIG. 2E shows the state of the area after dicing which contains about two chips 100a. Note that as the dicing tape 116, use may be made of, for example, a polyolefin tape with acrylic adhesive applied thereto.

Such dicing is performed while, for example, water for cleaning is being supplied in order to remove cutting fragments. The fixed film 104 is thin, but it is stuck onto the sacrifice layer 113. Thus, even though the fixed film 104 receives a pressure from supplied water, it is never broken easily.

Thereafter, the dicing tape 116 is peeled off, and etching is performed in the state of the chip 100a to remove the sacrifice layer 113. Thus, the remaining space serves as the cavity 102a. In the manner described above, the structure of the MEMS microphone chip 100 shown in FIG. 1 can be provided. Note that in this etching, HF can be used as an etching solution.

As described above, dicing for forming the wafer into chips can be performed before removal of the sacrifice layer 113 to prevent breakage of the fixed film 104. Then, the sacrifice layer 113 is removed after this dicing, and eventually the semiconductor device (the MEMS microphone chip 100) having the structure in which the vibrating film 103 and the fixed film 104 interpose the cavity 102a can be fabricated with good yield.

Moreover, the cutting fragments occurring in the dicing process are prevented from remaining, as the contaminants 201 as shown in FIG. 14, within the cavity 102a.

Specifically, in dicing, fragments appear from the semiconductor wafer 101, the intermediate film 102, the dicing tape 116, and the like, and in some cases, broken pieces of a dicing blade appear as the fragments. Such fragments may be smaller than the hole 103b or the sound hole 104a. If the sacrifice layer 113 is not provided in the device, it is conceivable that the fragments will enter the cavity 102a. Thus, the contaminants 201 occurring in the finished MEMS microphone chip 100 as shown in FIG. 14 degrade the quality of the device.

However, with the method of the first embodiment, the sacrifice layer 113 still remains in dicing. Therefore, the occurrence of the contaminants 201 shown in FIG. 14 is prevented. This results in improvement of quality and fabrication yield of the MEMS microphone chip 100.

Note that in the processes described above, the back grinding of the semiconductor wafer 101 is performed after formation of the fixed film 104 and before formation of the through hole 101*a*. However, the back grinding can also be performed before formation of the vibrating film 103 shown in FIG. 2A. In this case, using the semiconductor wafer 101 having been already thinned, formation of the vibrating film 103 is made as in the case of FIG. 2A.

Furthermore, the back grinding may be performed after formation of the fixed film 104 and subsequent formation of the through hole 101*a*.

As can be seen from the above, the MEMS microphone chip 100 can also be fabricated in the order of process steps differing from that shown in FIGS. 2A to 2E.

Modification of First Embodiment

Next description will be made of a method for fabricating a semiconductor device according to a modification of the first embodiment. When compared with the method for fabricating a semiconductor device according to the first embodiment, this modification is characterized in that a protective film is provided on the fixed film 104. This will now be described with reference to the accompanying drawings. FIGS. 3A and 3B are views showing characteristic processes in this modification.

First, as in the case of the first embodiment, the steps illustrated in FIGS. 2A to 2D are carried out. Then, as shown in FIG. 3A, a protective film 117 is formed on the fixed film 104, and the dicing tape 116 is stuck onto the back surface of the semiconductor wafer 101. Thereafter, the semiconductor wafer 101 as well as the protective film 117 is subjected to blade dicing along the cutting line L to provide the chips 100*a* as shown in FIG. 3B. With this method, the protective film 117 further reliably prevents breakage of the fixed film 104, so that the fabrication yield of the MEMS microphone chip 100 can be improved. Note that the protective film 117 can be formed by using acrylic or the like as the material.

Thereafter, the protective film 117 is removed. This removal can also be made after dicing and as an independent step for the removal of the protective film 117. In this case, after removal of the protective film 117, etching is performed to remove the sacrifice layer 113, and then the semiconductor device shown in FIG. 1 can be provided.

Instead of removing the protective film 117 in an independent step, the protective film 117 can also be removed simultaneously with an etching for removing the sacrifice layer 113. With this, the semiconductor device shown in FIG. 1 can be provided with an increase in the number of process steps suppressed.

Second Embodiment

A method for fabricating a semiconductor device according to a second embodiment of the present invention will be described below with reference to the accompanying drawings. Also in the second embodiment, description will be made by using as an example the MEMS microphone chip 100 shown in FIG. 1. Since process steps except removal of the sacrifice layer 113 and chip formation are the same as those of the first embodiment, the chip formation process will be described mainly in the second embodiment. Note that FIGS. 4A to 4C, 5A, and 5B are views illustrating fabrication steps of the semiconductor device of the second embodiment.

To be more specific, first, process steps shown in FIGS. 2A to 2D are carried out in the same manner as those in the first embodiment. Thereby, the semiconductor wafer 101 as shown in FIG. 2D can be provided which has a plurality of structures serving as chips, respectively.

Next, as shown in FIG. 4A, the semiconductor wafer 101 is subjected to an etching process to remove the respective sacrifice layers 113 from the structures still in the wafer state. Thus, the remaining spaces serve as the cavities 102*a*. Also in FIG. 4A, the cutting line L along which dicing is to be performed later is shown, and by the later dicing, the region surrounded with the cutting line L is formed into one chip. Thus, a region in the semiconductor wafer 101 containing about two chips is shown in FIG. 4A.

Subsequently, as shown in FIG. 4B, a laser 118 for dicing is radiated onto the cutting line L of the semiconductor wafer 101 from the back-surface side. This alters the portions of the semiconductor wafer 101, the intermediate film 102, and the fixed film 104 which are radiated with the laser 118 (in the vicinity of the cutting line L), thereby producing altered layers 202 which have degraded physical strengths.

With such construction, when, as shown in FIG. 4C, a dicing tape is then stuck onto the back surface of the semiconductor wafer 101 and expanding is conducted, the semiconductor wafer 101 and the like are cut at the position radiated with the laser 118 to separate the chips. In this description, "expanding" means that the dicing tape 116 is outwardly pulled to be expanded in order to apply, to the semiconductor wafer 101 after radiation of the laser 118*a*, a force in the direction along the wafer surface. FIG. 4C shows the expanding in which the dicing tape 116 is pulled in the direction indicated by the arrow F.

In the manner described above, the MEMS microphone chip 100 as shown in FIG. 1 can be fabricated.

Note that each of the chips separated has the altered layer 202 remaining around itself. If the output of the radiated laser is 1 to 10 W, the width K of the remaining altered layer 202 is about 1 to 5 μm.

FIGS. 4B and 4C show the state of the wafer in which the entire portions of the semiconductor wafer 101, the intermediate film 102, and the fixed film 104 contained in the laser-radiated cutting line L have been changed into the altered layers 202. However, an alternative state may be formed in which only a limited area is changed into the altered layer 202 and a portion left without being altered is also present. It is sufficient that the altered layer 202 is formed by such an amount that the chips 100 are separated from each other by the expanding shown in FIG. 4C.

The altered layer 202 is typically made of a polycrystalline layer. To be more specific, a wafer of single-crystal silicon can be used as the semiconductor wafer 101 in the second embodiment, and in this case, the crystal structure of the laser-radiated portion is altered to produce the altered layer 202 made of a polycrystalline layer.

Single-crystal silicon ideally has a diamond lattice structure in which all atoms are regularly arranged. On the other hand, in the case of a polycrystalline layer, a crystal structure in which atoms are regularly arranged is only locally observed, and a great number of such local crystal structures gather to produce the polycrystalline layer. Therefore, the polycrystalline layer does not have a regular arrangement ranging widely. Accordingly, laser radiation reduces the region having a regular atom arrangement.

Such a difference between single crystal and polycrystal can be identified by, for example, Raman spectroscopy.

The laser radiation and the laser dicing by the expanding as described above are performed without supplying any cleaning water. Therefore, the fixed film 104 above the cavity 102*a* is never broken by a pressure from the cleaning water or the like.

As described above, even in the case where before dicing, the sacrifice layer 113 is removed in the wafer state, the dicing conducted by laser dicing can successfully avoid breaking the fixed film 104 by a pressure from the cleaning water. Thus, the yield obtained in fabricating the MEMS microphone chip 100 can be improved.

Figure 5A:
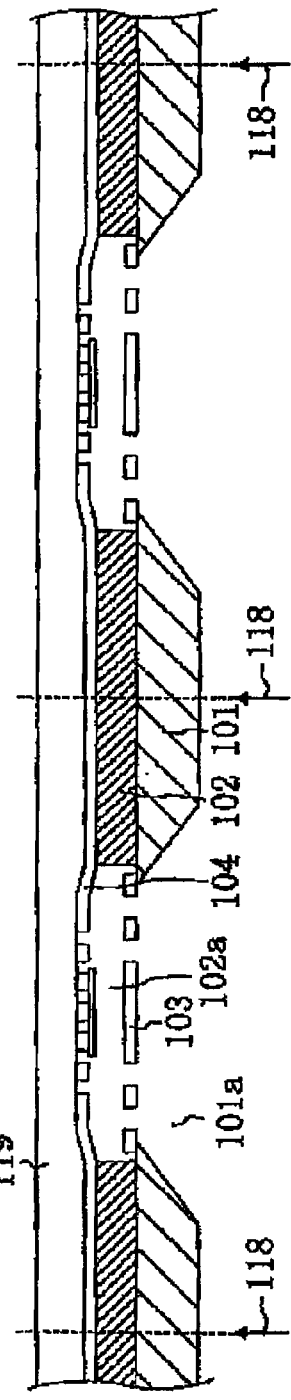
FIGS. 5A to 5C are views following FIGS. 4A to 4C, which illustrate the method for fabricating a semiconductor device according to the second embodiment of the present invention.

Before the laser radiation, a surface protective tape 119 may be stuck onto the fixed film 104 as shown in FIG. 5A. Thereafter, the laser 118 is radiated from the back-surface side of the semiconductor wafer 101. Moreover, when the dicing tape 116 is stuck onto the back surface of the semiconductor wafer 101 and the surface protective tape 119 is peeled off, expanding can be conducted in the same manner as shown in FIG. 4C. Such use of the surface protective tape 119 can prevent the fixed film 104 and the like from being damaged in dicing, and thereby the MEMS microphone chip 100 can be fabricated more reliably. Furthermore, the surface protective tape 119 can prevent the contaminants 201 from entering the cavity 102a (see FIG. 14).

Figure 5B:
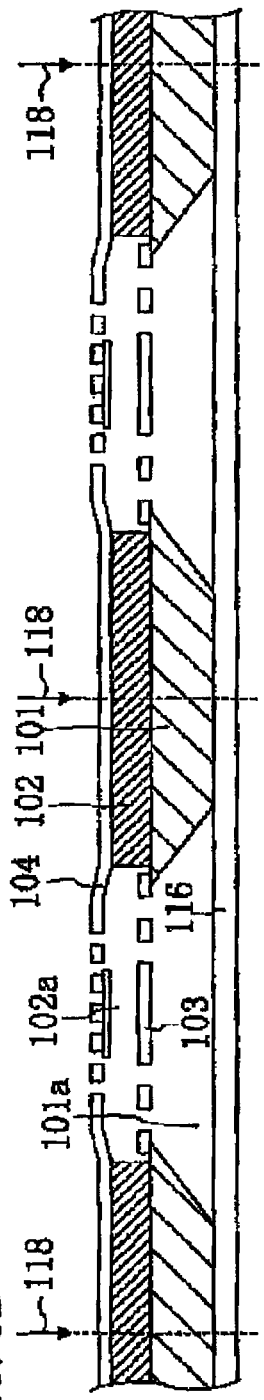

After removal of the sacrifice layer 113 by subjecting the semiconductor wafer 101 to etching, the dicing tape 116 may be stuck onto the back surface of the semiconductor wafer 101 as shown in FIG. 5B. In this case, the laser 118 is radiated from the front-surface side of the semiconductor wafer 101. After this radiation, expanding as shown in FIG. 4C is also conducted to cut the semiconductor wafer 101 along the portion altered by the laser radiation. Thereby, the wafer can be formed into chips.

As is apparent from the above, the laser radiation can be conducted from either the front- or back-surface side of the semiconductor wafer 101. Also in the case shown in FIGS. 5A and 5B, laser radiation produces an altered layer, but its illustration is omitted.

Figure 5C:
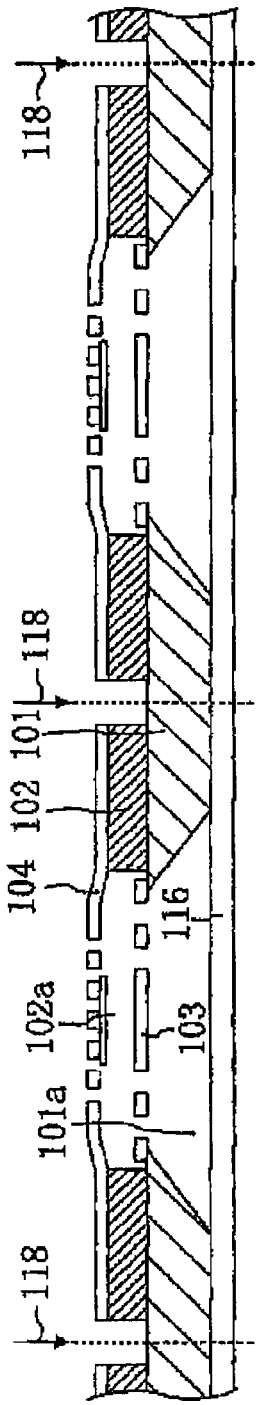

In the cutting line L to be radiated with the laser 118, if an oxide film, a metal film, or the like is present on the surface thereof the laser enters, the laser 118 may then be reflected. In the case where the laser is thus reflected, the laser dicing is difficult to perform. However, as described above, the laser radiation can be made from either side of the semiconductor wafer 101. Therefore, if either one of the front and back surfaces of the wafer does not have an oxide film, a metal film, or the like, chip formation by laser dicing can be made (see, FIG. 5C).

Note that the respective components in the second embodiment can be made of the same materials as those used in the first embodiment. A chemical solution used for etching is also the same as that used in the first embodiment.

Modification of Second Embodiment

Figure 6A:
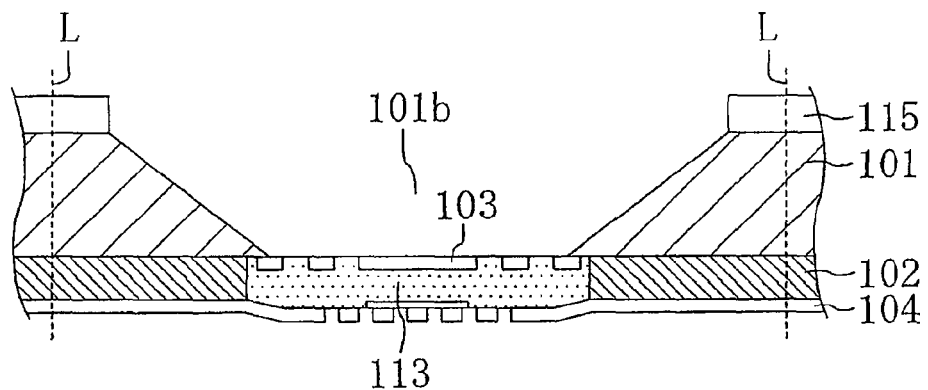
FIGS. 6A to 6C are views illustrating a method for fabricating a semiconductor device according to a modification of the second embodiment of the present invention.
Figure 6B:
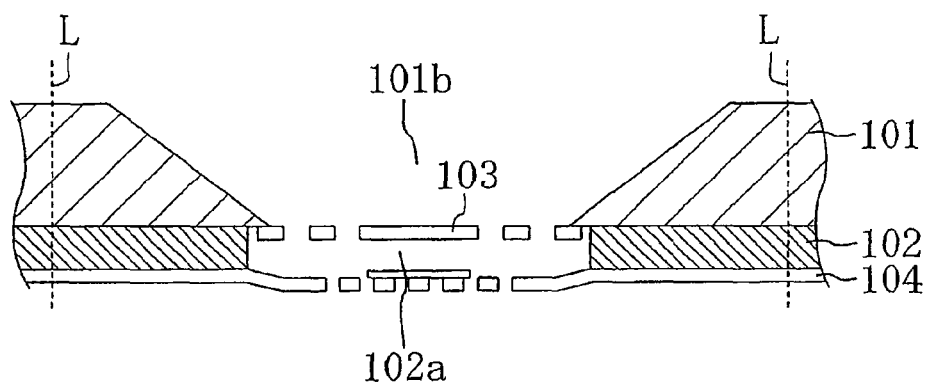
Figure 6C:
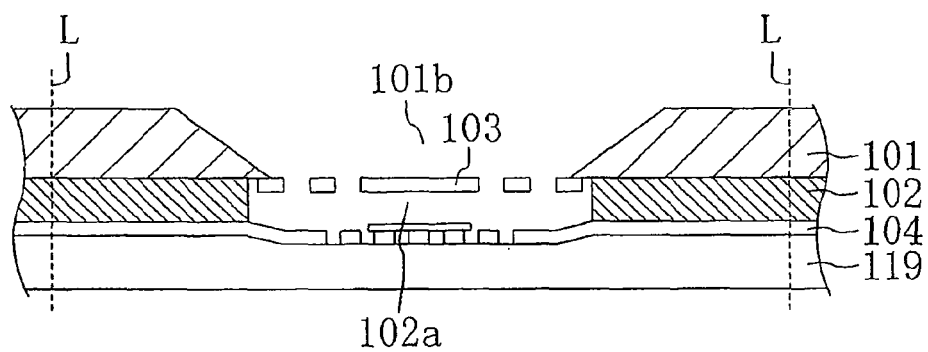

A modification of the second embodiment will be described below. FIGS. 6A to 6C are views illustrating semiconductor device fabrication steps according to this modification. In this modification, like the first embodiment, the procedure up to formation of the fixed film 104 is first carried out to provide the structure shown in FIG. 2B.

Next, a mask 115 is formed on the back surface of the semiconductor wafer 101, and the semiconductor wafer 101 is etched from the back-surface side. Thereby, a through hole 101b is formed, so that the vibrating film 103 is exposed with the back surface facing the through hole 101b. This state is shown in FIG. 6A.

Subsequently, as shown in FIG. 6B, the sacrifice layer 113 is removed by etching. Thus, the remaining space serves as the cavity 102a. Thereafter, as shown in FIG. 6C, the surface protective tape 119 is stuck onto the fixed film 104, and then the back surface of the semiconductor wafer 101 is ground (back grinding is performed). This thins the semiconductor wafer 101. That is to say, when this modification is compared with the second embodiment, the step of removing the sacrifice layer 113 and the step of performing a back grinding are carried out in the reverse order.

Then, the same laser radiation as that shown in FIG. 5A is conducted. Thereby, the portion radiated with the laser 118 is altered to have a physically poor strength. Further, like FIG. 4C, after the dicing tape 116 is stuck and the surface protective tape 119 is peeled off, expanding is conducted. Thereby, the semiconductor wafer 101, the intermediate film 102, and the fixed film 104 are cut at the portion radiated with the laser 118. As a result of this, individual chips can be fabricated which each contain the structure having the fixed film 104 over the vibrating film 103 with the cavity 102a interposed therebetween.

With this modification, the surface protective tape 119 can be used to carry out the two processes, that is, the back grinding and the laser radiation. To be more specific, as compared with the case like the second embodiment where after peeling off of the BG tape 114 used in back grinding, laser radiation is made using the surface protective tape 119, the number of tapes used can be decreased. Moreover, the numbers of tape-sticking and -peeling steps can also be decreased. As a result of this, simplification of the fabrication processes and cost reduction can be made.

Third Embodiment

A method for fabricating a semiconductor device according to a third embodiment of the present invention will be described below with reference to the accompanying drawings. Also in the third embodiment, description will be made by using as an example the MEMS microphone chip 100 shown in FIG. 1. Since process steps except removal of the sacrifice layer 113 and chip formation are the same as those of the first embodiment, the chip formation process will be described mainly in the third embodiment. Note that FIGS. 7A to 7C, 8A, and 8B are views illustrating a method for fabricating a semiconductor device according to the third embodiment.

To be more specific, first, process steps shown in FIGS. 2A to 2D are carried out in the same manner as the first embodiment. Thereby, the semiconductor wafer 101 as shown in FIG. 2D can be provided which has a plurality of structures having the fixed film 104 formed over the vibrating film 103 with the sacrifice layer 113 interposed therebetween.

Next, as shown in FIG. 7A, the semiconductor wafer 101 is subjected to an etching process to remove the respective sacrifice layers 113 from the structures still in the wafer state. Thus, the remaining spaces serve as the cavities 102a. In FIG. 7A, the cutting line L along which dicing is to be performed later is also shown, and about two regions in the wafer 101 to be formed into chips, respectively, by dicing are also shown.

Subsequently, as shown in FIG. 7B, a protective film 117 is formed on the fixed film 104. It is sufficient that this film is made of, for example, acrylic. Then, the dicing tape 116 is stuck onto the back surface of the semiconductor wafer 101.

As shown in FIG. 7C, blade dicing is performed on the semiconductor wafer 101 as well as the protective film 117. During this dicing, the protective film 117 is formed on the fixed film 104 to prevent the fixed film 104 from being broken by a pressure from cleaning water that accompanies the dicing.

With this procedure, even though blade dicing accompanying supply of cleaning water is employed, the dicing can be performed while the protective film 117 prevents breakage of the fixed film 104, thereby providing chips.

During such dicing, the protective film 117 having been formed avoids the occurrence of contaminants 201 within the cavity 102a as shown in FIG. 14.

Thereafter, the protective film 117 is removed, and then the MEMS microphone chip 100 identical to the structure in FIG. 1 can be provided. It is sufficient that for removal of the protective film 117, for example, the chip provided by the dicing is taken off from the dicing tape 116 and moved to a chip holder 120 as shown in FIG. 8A, and then cleaning or the like with IPA (isopropyl alcohol) or the like is performed on the chip. This enables more reliable cleaning.

As an alternative method for removing the protective film 117, as shown in FIG. 8B, the chips held stuck onto the dicing tape 116 can also be subjected to IPA cleaning. This case has an advantage that a more simple process can be provided since moving the chip to the chip holder is eliminated.

In the manner described above, the semiconductor device having the structure in which the fixed film 104 is formed over the vibrating film 103 with the cavity 102a interposed therebetween, specifically, the MEMS microphone chip 100 can be fabricated with good yield. Moreover, prevention of the occurrence of contaminants can attain improvement of the quality and yield of the device.

Note that the process steps described above are carried out in the order of: formation of the fixed film 104; back grinding; and formation of the through hole 101a. However, as in the case of the first embodiment, back grinding may be performed before formation of the vibrating film 103.

Figure 9A:
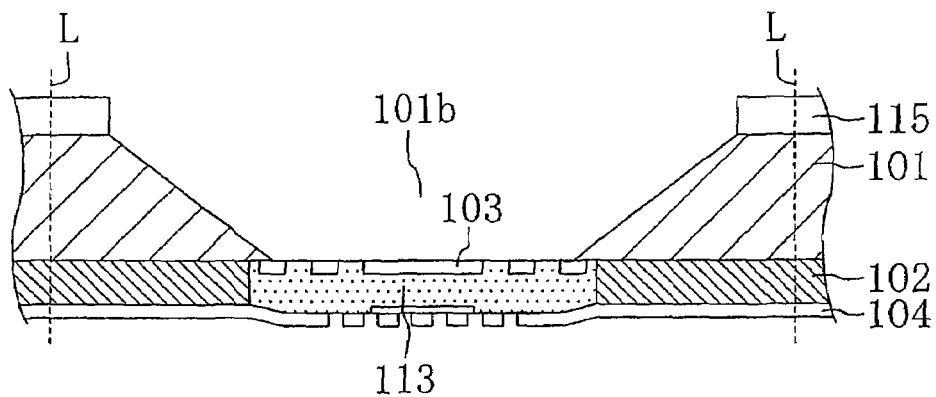
FIGS. 9A to 9C are views illustrating other process steps of the method for fabricating a semiconductor device according to the third embodiment of the present invention.
Figure 9B:
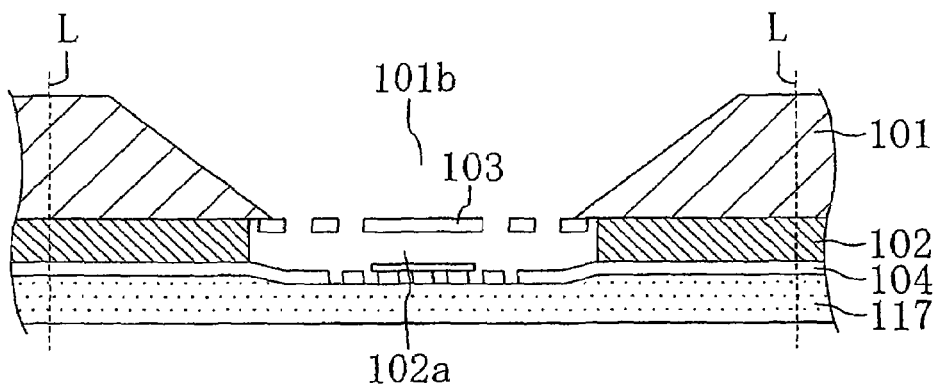
Figure 9C:
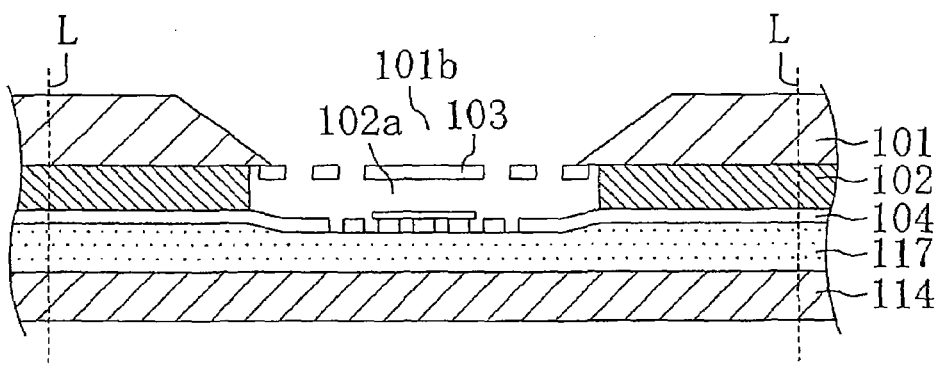

Furthermore, back grinding can also be performed after formation of the protective film 117 and before dicing. FIGS. 9A to 9C are views illustrating process steps carried out in this case.

To be more specific, after formation of the structure shown in FIG. 2B, as shown in FIG. 9A, the mask 115 is provided on the back surface of the semiconductor wafer 101. Then, etching using this mask is performed to form the through hole 101b.

Next, as shown in FIG. 9B, the protective film 117 is formed on the fixed film 104. Then, the BG tape 114 is stuck onto the protective film 117, and the resulting semiconductor wafer 101 is subjected to back grinding. Thereby, as shown in FIG. 9C, the semiconductor wafer 101 is thinned from the back-surface side. After the BG tape 114 is peeled off, the dicing tape 116 is stuck and blade dicing is performed in the same manner as shown in FIGS. 7B and 7C. Removal of the protective film 117 is also made as described above.

Fourth Embodiment

A method for fabricating a semiconductor device according to a fourth embodiment of the present invention will be described below with reference to the accompanying drawings. FIGS. 10A, 10B, and 11A to 11C are views illustrating the method for fabricating a semiconductor device according to the fourth embodiment.

Also in the fourth embodiment, description will be made by using as an example the MEMS microphone chip 100 shown in FIG. 1. Since process steps except removal of the sacrifice layer 113 and chip formation are the same as those of the first embodiment, the chip formation process will be described mainly in the fourth embodiment.

First, process steps up to formation of the fixed film 104 are carried out in the same manner as those in the first embodiment, and thereby the structure shown in FIG. 2B is provided. That is to say, the structure is provided in which the vibrating film 103 is formed on the semiconductor wafer 101 and the fixed film 104 is formed over the vibrating film 103 with the sacrifice layer 113 interposed therebetween. At this point in time, back grinding has not been conducted yet.

Figure 10A:
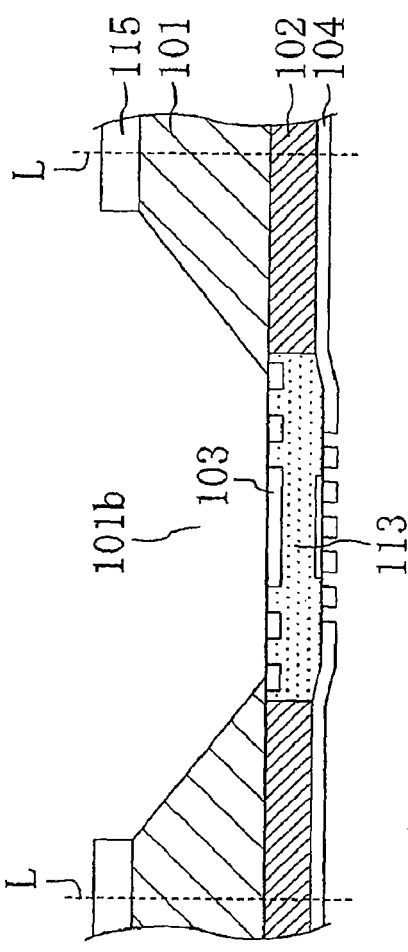
FIGS. 10A and 10B are views illustrating a method for fabricating a semiconductor device according to a fourth embodiment of the present invention.

Next, as shown in FIG. 10A, the mask 115 is formed on the back surface of the semiconductor wafer 101 (the surface of the wafer opposite to the surface formed with the vibrating film 103), and the semiconductor wafer 101 is etched from the back-surface side. Thereby, the through hole 101b is formed, so that the vibrating film 103 is exposed with the back surface facing the through hole 101b.

Figure 10B:
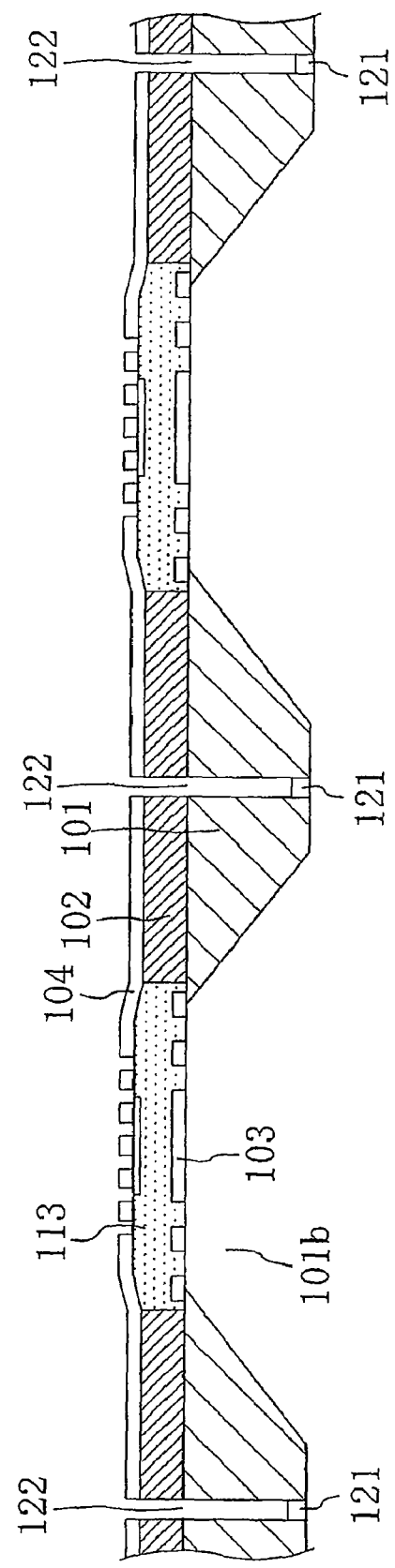

Subsequently, blade dicing is performed from the front-surface side of the semiconductor wafer 101. Note that as shown in FIG. 10B, this blade dicing is performed from the front-surface side to provide a groove 122 and concurrently to leave, around the back surface of the semiconductor wafer 101, a portion of the semiconductor wafer 101 serving as a thin connection portion 121. As a result of this, regions of the semiconductor wafer 101 to be formed into chips are in the state in which they are connected to each other by the connection portions 121 made by leaving thin portions of the semiconductor wafer 101.

In such blade dicing, since the fixed film 104 is stacked on the sacrifice layer 113, breakage of the film by a pressure from cleaning water is avoided. Moreover, since the sacrifice layer 113 is present, contaminants 201 as shown in FIG. 14 are prevented from remaining due to unwanted fragments occurring in dicing.

Subsequently to the dicing, as shown in FIG. 11A, the semiconductor wafer 101 formed with the groove 122 is subjected to an etching process to remove the sacrifice layer 113. Thus, the remaining space serves as the cavity 102a.

As shown in FIG. 11B, the BG tape 114 is stuck onto the fixed film 104, and then the back surface of the semiconductor wafer 101 is ground. Such back grinding is performed at least until the connection portion 121 is ground away and the grinding reaches the groove 122. Thereby, the regions to serve as the individual chips, which are connected by the connection portion 121, are separated from each other, and thus the MEMS microphone chip 100 identical to that shown in FIG. 1 can be fabricated.

Thereafter, as shown in FIG. 11C, the dicing tape 116 is stuck to come into contact with the back surfaces of the individual chips. Then, by peeling off the BG tape 114, transfer to the dicing tape 116 can be made.

As described above, by dicing, the groove 122 is formed from the front-surface side of the semiconductor wafer 101 to surround the region which contains the vibrating film 103 and the fixed film 104 and which is to serve as a chip. Then, the sacrifice layer 113 is removed, and thereafter back grinding is performed from the back-surface side of the semiconductor wafer 101. With this method, a semiconductor device like the MEMS microphone chip 100 can be fabricated while breakage of the fixed film 104 is prevented. Moreover, the occurrence of contaminants in the dicing process is prevented to attain improvement of the quality and fabrication yield of the device.

Figure 12:
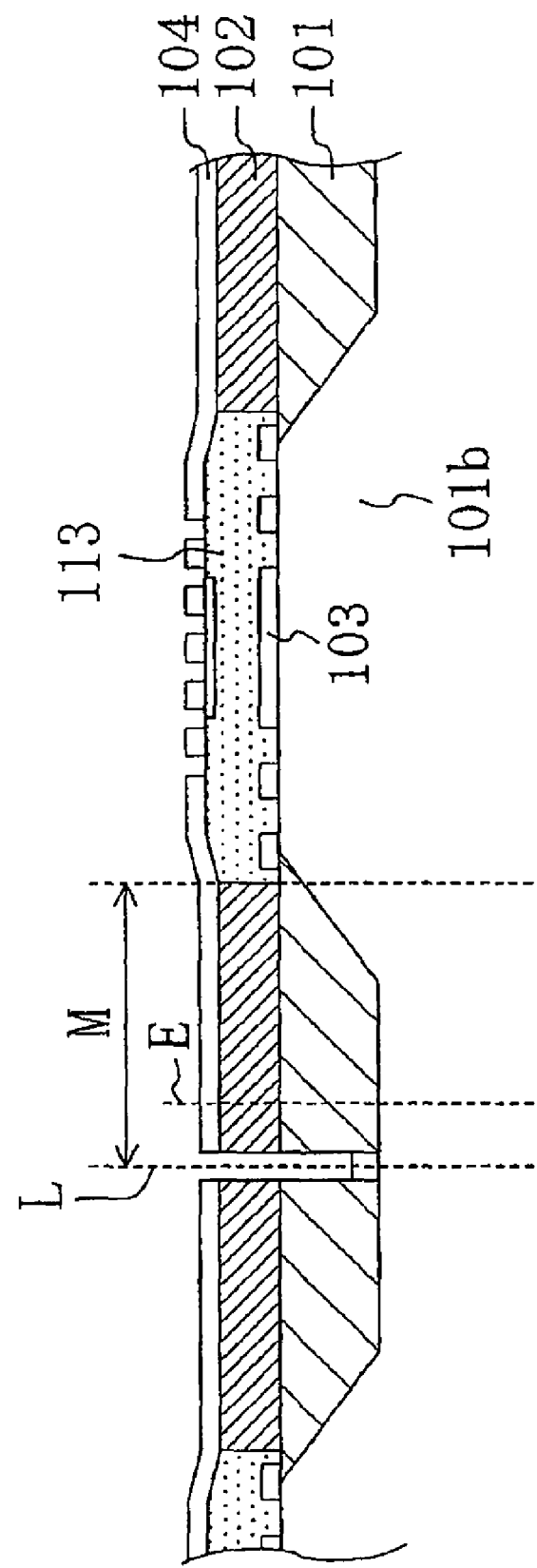
FIG. 12 is a view illustrating the distance M between a cutting line L and a sacrifice layer 113 in the method for fabricating a semiconductor device according to the fourth embodiment of the present invention.
Figure 13A:
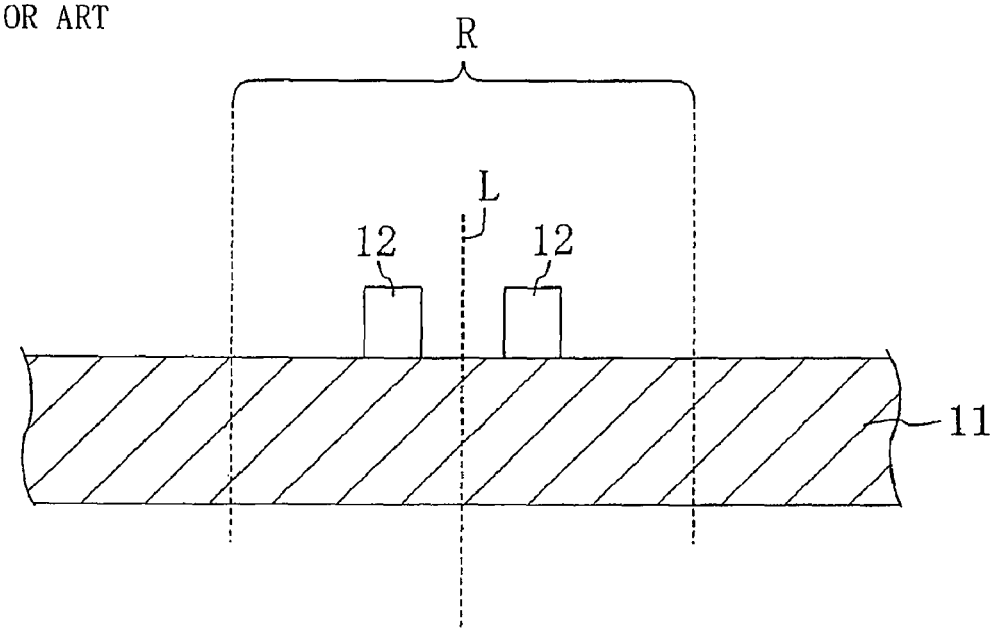
FIGS. 13A and 13B are views illustrating a conventional technique of dicing.
Figure 13B:
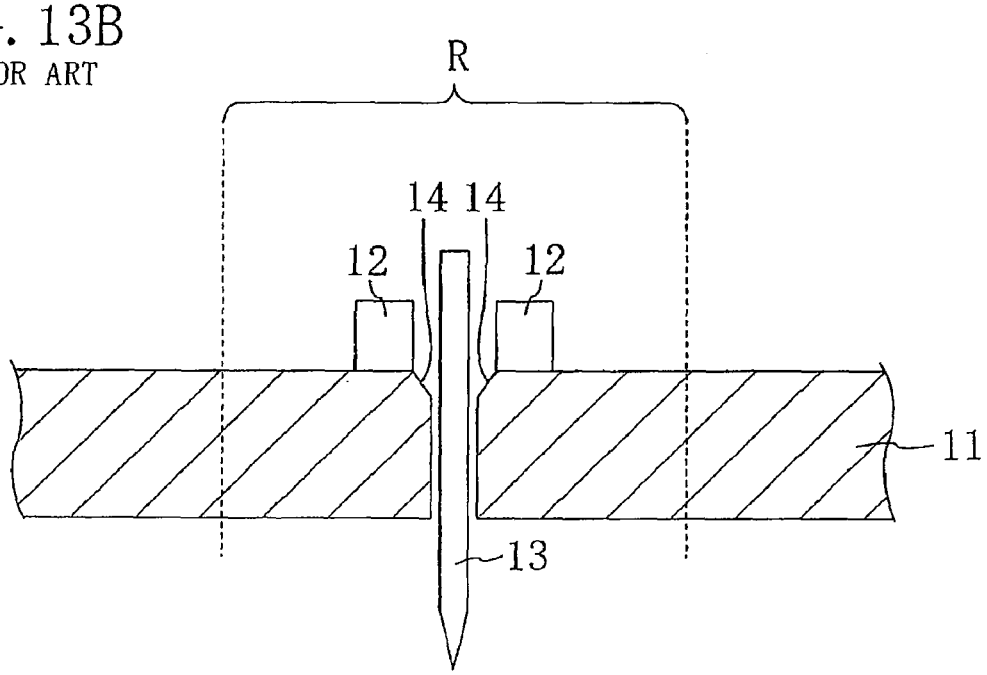

In the etching for removing the sacrifice layer 113, the side surface of the groove 122 can also be etched to increase the width of the groove 122. For example, as shown in FIG. 12, the etching can proceed from the cutting line L up to the side-surface etching position E. If such trouble arises, there is a possibility that the trouble affects the function of the semiconductor device (the MEMS microphone chip 100) to be fabricated.

To avoid this trouble, for example, as shown in FIG. 12, the distance M from the cutting line L to the sacrifice layer 113 that will be the cavity 102*a* later is set to allow an adequate margin in consideration of the etched amount of the side surface of the groove 122 by the etching process. With this setting, even though the side surface of the groove 122 is etched to, for example, the side-surface etching position E, the function of the semiconductor device to be fabricated can avoid being affected by this trouble.

Note that in any of the above embodiments, the described materials of the respective components and the like are only illustrative, and there is no special limitation on them.

What is claimed is:

1. A method for manufacturing a MEMS microphone, comprising steps of:
    (a) forming a vibrating film on a silicon semiconductor wafer including a plurality of chip regions;
    (b) forming a fixed film with a plurality of first holes above the vibrating film;
    (c) forming a second hole by etching the silicon semiconductor wafer in each of the plurality of chip regions so as to expose a back surface of the vibrating film;
    (d) providing a cavity between the vibrating film and the fixed film by etching;
    (e) modifying a crystalline structure of the silicon semiconductor wafer by irradiating a scribe region surrounding each of the plurality of chip regions with a laser from a side of a surface of the silicon semiconductor wafer on which the fixed film is formed; and
    (f) dicing the silicon semiconductor wafer along the modified crystalline structure, wherein:
    the step (e) is carried out after the step (d), and
    in the step (e), a cutting area in the scribe region of the silicon semiconductor wafer is irradiated with the laser, and no deposited oxide film is provided in the cutting area, which is irradiated with the laser, on the surface of the side of the silicon semiconductor wafer on which the fixed film is formed.

2. The method for manufacturing a MEMS microphone according to claim 1, wherein in the step (e), no metal film is provided in the cutting area, which is irradiated with the laser, on at the surface of the side of the silicon semiconductor wafer on which the fixed film is formed.

3. The method for manufacturing a MEMS microphone according to claim 1, further comprising a step of applying a dicing tape to the surface of the silicon semiconductor wafer opposite to the surface formed with the fixed film.

4. The method for manufacturing a MEMS microphone according to claim 3, wherein the dicing tape is applied prior to irradiating the scribe region with the laser.

5. The method for manufacturing a MEMS microphone according to claim 2, further comprising a step of applying a dicing tape to the surface of the silicon semiconductor wafer opposite to the surface formed with the fixed film.

6. The method for manufacturing a MEMS microphone according to claim 5, wherein the dicing tape is applied prior to irradiating the scribe region with the laser.

7. The method for manufacturing a MEMS microphone according to claim 1, wherein the step (d) is carried out after the step (c).

8. The method for manufacturing a MEMS microphone according to claim 2, wherein the step (d) is carried out after the step (c).

* * * * *